United States Patent [19]

Graupe et al.

[11] 4,025,721
[45] May 24, 1977

[54] METHOD OF AND MEANS FOR ADAPTIVELY FILTERING NEAR-STATIONARY NOISE FROM SPEECH

[75] Inventors: Daniel Graupe, Fort Collins, Colo.; G. Donald Causey, Chevy Chase, Md.

[73] Assignee: Biocommunications Research Corporation, Chevy Chase, Md.

[22] Filed: May 4, 1976

[21] Appl. No.: 683,234

[52] U.S. Cl. .......................... 179/1 P; 179/107 FD
[51] Int. Cl.² ........................................ H04R 27/00
[58] Field of Search ................ 179/1 P, 1 D, 1 SA, 179/107 R, 107 FD

[56] References Cited

UNITED STATES PATENTS

| | | | |
|---|---|---|---|
| 3,126,449 | 3/1964 | Shirman | 179/1 P |
| 3,784,749 | 1/1974 | Shigeyama et al. | 179/1 P |
| 3,803,357 | 4/1974 | Sacks | 179/1 P |
| 3,889,059 | 6/1975 | Thompson | 179/1 P |
| 3,894,195 | 7/1975 | Kryter | 179/107 FD |

*Primary Examiner*—William C. Cooper
*Assistant Examiner*—E. S. Kemeny
*Attorney, Agent, or Firm*—Donald M. Sandler

[57] ABSTRACT

By identifying and analyzing the properties of the parameters of an input signal that contains speech in the presence of simultaneously occuring near-stationary noise, pauses between speech intervals as well as the termination of such noise can be recognized. When a pause interval containing noise is recognized, the parameters identified during such interval are used to set the parameters of an adaptive filter through which the input signal is passed during subsequent intervals of speech and until the noise terminates. During the time the input signal passes through the filter, the near-stationary noise is filtered out. In response to recognition of the termination of noise, the input signal is caused to by-pass the filter which is then prepared to accept the parameters of noise occuring in a subsequent pause.

28 Claims, 6 Drawing Figures

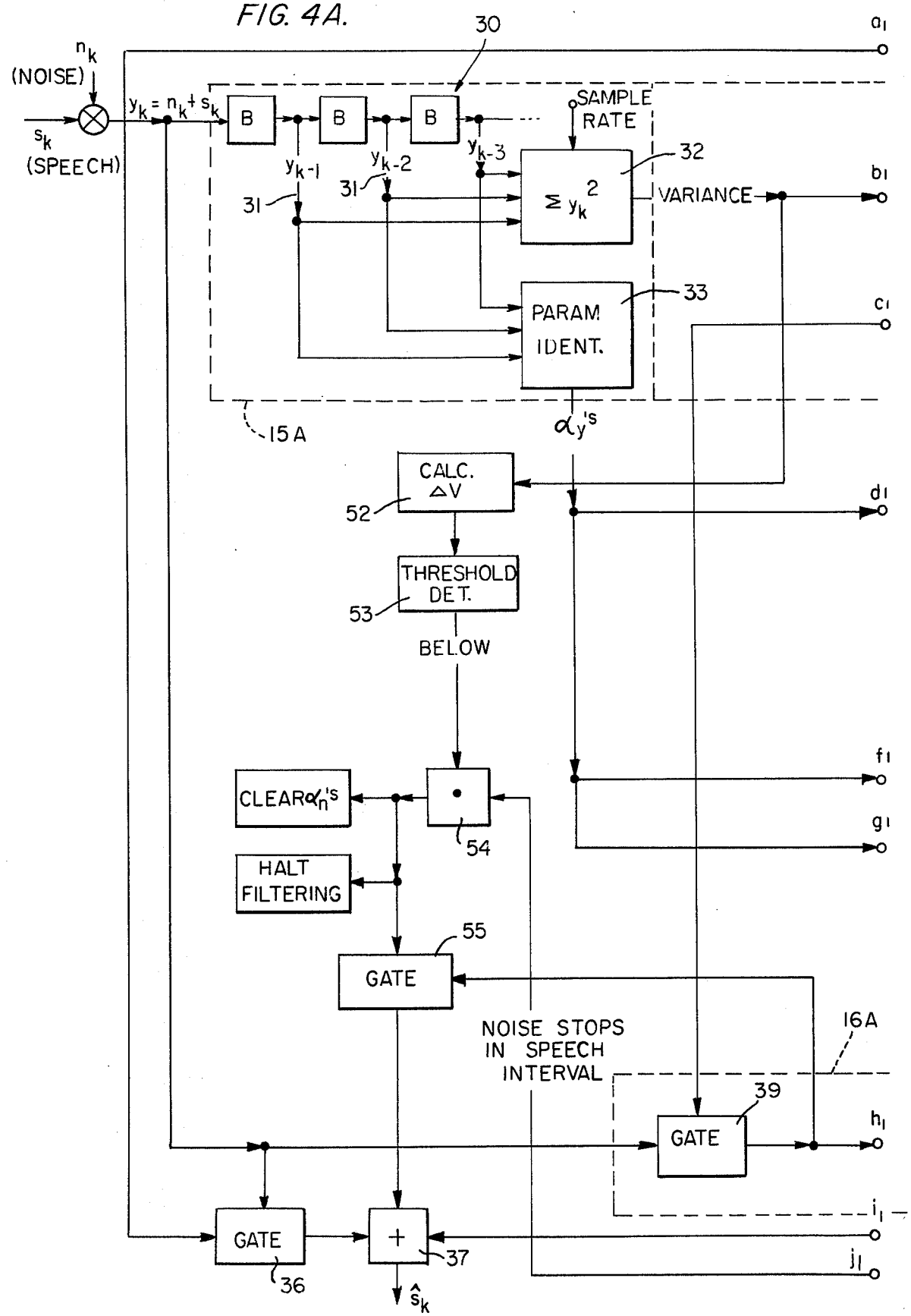

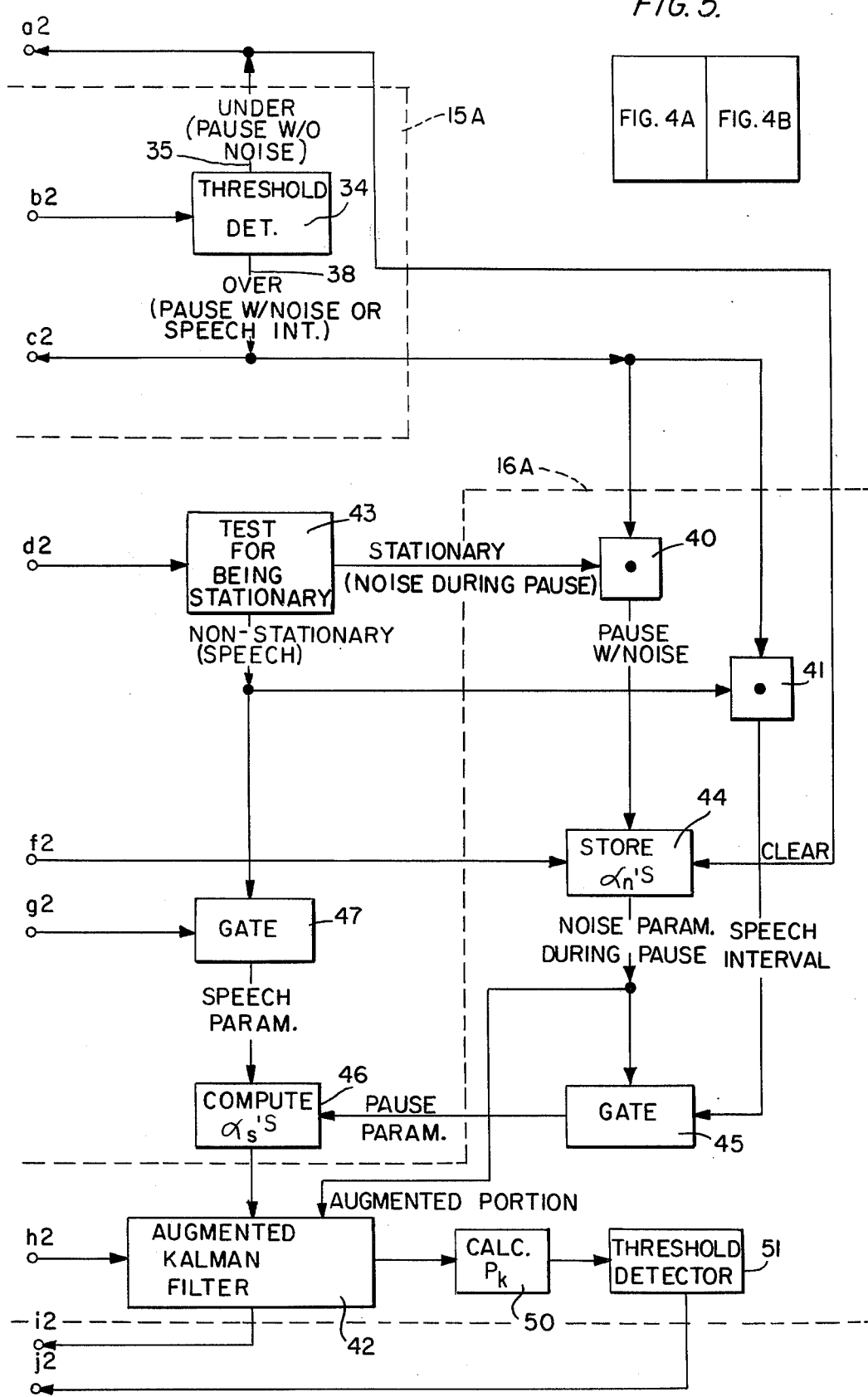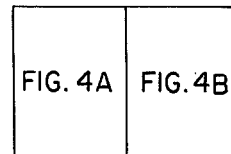

METHOD OF AND MEANS FOR ADAPTIVELY FILTERING NEAR-STATIONARY NOISE FROM SPEECH

CROSS-REFERENCES TO RELATED PRIOR ART

The followng references, helpful to an understanding of the present invention, are hereby incorporated by reference:
1. D. Graupe, "Identification of Systems", Krieger Publishing Company, Huntington, N.Y., 1976;
2. E. Parzen, IEEE Trans. on Auto Control, December, 1974;
3. Sage and Melsa, "Estimation Theory with Applications to Communications and Control", McGraw Hill, 1971;
4. N. Levenson and N. Wiener, "Extrapolation, Interpolation and Smoothing of Stationary Time Series," MIT Press, 1964;
5. Y. Z. Tsypkin, "Foundations of the Theory of Learning Systems", Academic Press, N.Y., 1973;
6. M. Schwarz and L. Shaw, "Signal Processing", McGraw Hill, N.Y., 1975; and
7. D. E. Johnson and J. L. Hilburn, "Rapid Practical Design of Active Filters", John Wiley & Sons, N.Y., 1975.

BACKGROUND OF THE INVENTION

This invention relates to a method of and means for filtering environmental noise from speech, and more particularly noise that is near-stationary and of relatively long duration.

Environmental noise is often tolerated by persons with unimpaired hearing with no more discomfort than annoyance at the existence of such noise and the loss of ability to understand speech in the presence of such noise. For persons with impaired hearing fitted with a hearing aid having a fixed frequency spectrum, environmental noise is often disturbing, often interferes with their ability to understand speech, and is sometimes physically painful.

Environmental noise can be classified as follows:
1. relatively short duration noise such as clicking of shoes during walking, or dishes during stacking;
2. relatively long duration noises having near stationary spectral characteristics such as the noise associated with passing cars, trains and airplanes, or running fans or machinery; and
3. relatively long duration noises that lack stationary spectral characteristics such as a background conversation, etc.

The last mentioned class of noise may mask speech preventing its being understood by a hearing aid user and is disturbing for this reason. However, this type of noise does not assault the user's ear as do clicking noises and near-stationary noises of relatively long duration.

A relatively satisfactory solution to the problem of clicking noises is obtained by incorporating automatic gain control (AGC) into the circuitry of the hearing aid. Such circuitry responds to a sudden, high volume click, by automatically reducing the volume for the duration of the click thus suppressing the input to the user's ear. This eliminates not only the sound of the click, but any intelligence occuring simultaneously with the click. No loss of intelligibility of speech occurs, however, because of the short duration of the gain reduction and the ability of the ear to fill in a relatively short information gap.

So far as is known, however, no practical solution exists to the problem encountered with hearing aids due to near-stationary noise of relatively long duration. For the purpose of this description, the term "near-stationary, relatively long duration noise", hereinafter referred to as noise of the type described, refers to noise having particular time and spectral characteristics, namely noise of a duration exceeding about three seconds and whose frequency spectrum does not vary with time or varies with only within a narrow range. As indicated above, vehicular and machinery noises are examples of noise of the type described. The minimum duration of noise of the type described is thus considerably longer than intervals of normal speech occuring between speech pauses.

It is therefore an object of the present invention to provide a novel method of, and means for, filtering noise of the type described from speech, whereby hearing aids or other devices can be adapted to operate properly under changing environmental noise situations.

SUMMARY OF THE INVENTION

Noise of the type described is filtered from speech by providing a system that identifies and analyzes the properties of an input signal that contains speech in the presence of such noise. Pauses between speech intervals as well as the termination of the noise can be recognized. When a pause interval containing noise is recognized, the parameters identified during such interval are used to set the parameters of an adaptive filter through which the input signal is passed during subsequent intervals of speech and until the noise terminates. During the time the input signal passes through the filter, the near-stationary noise is filtered out. In response to recognition of the termination of noise, the input signal is caused to by-pass the filter which is then prepared to accept the parameters of noise occuring during a subsequent pause.

The system of the present invention has two components: a recognition substystem, and an adaptive filer subsystem. The recognition subsystem performs a parameter identification algorithm that identifies the parameters of the input signal. Such identification is carried out at intervals of time much smaller than the smallest interval of speech or pause between speech intervals likely to occur in normal speech patterns. At regular intervals, the identified parameters are examined to determine whether they meet criteria for being considered stationary, or near-stationary. If the criteria are met, the recognition subsystem is effective to determine whether the noise is occuring in the absence of speech, i.e., during a pause, the identified parameters are furnished to the adaptive filter whose characteristic is thereby adapted to the noise, and the input signal is switched to the filter input.

The adaptive filter subsystem not only serves to filter out the noise in the input signal during the subsequent speech interval, but serves to determine whether the noise has terminated during a speech interval, i.e., before a pause occurs. If termination during a speech interval occurs, the input signal is caused to by-pass the filter, and its operation is stopped until a future pause containing noise of the type described is detected.

The parameters identified by the recognition subsystem may be stored at times other than during pauses containing noise and used by the adaptive filter at other times.

An adaptive filter according to the present invention must be computationally powerful and fast, and can be built from well known digital components. While many applications of the present invention are not size, weight, or cost constrained, the application of the present invention to hearing aids requires the use of microcomputer techniques. An adaptive filter so constructed can be coupled electrically to a conventional ear-borne hearing aid, or a hearing aid of the type disclosed in co-pending application Ser. No. 660,513, filed Feb. 23, 1976. Alternatively, the adaptive filter of the present invention can be carried by the user in his pocket and linked to a hearing aid via wire or radio.

The adaptive filter of the present invention also has general application to other types of voice communication systems operating in the presence of high-level environmental noise that is essentially near-stationary. Examples of such systems are the engine-room to bridge voice communication link aboard a ship, and intercrew voice communication links aboard helicopters or tanks.

BRIEF DESCRIPTION OF THE DRAWINGS

Embodiments of the present invention are illustrated by way of example in the accompanying drawings wherein:

FIGS. 4A and 4B are portions of a detailed block diagram of one embodiment of the adaptive filter of the present invention; and FIG. 5 is a composite showing how the partial block diagram of FIGS. 4A and 4B fit together to form a composite block diagram.

DETAILED DESCRIPTION OF THE DRAWINGS

Figure 1:
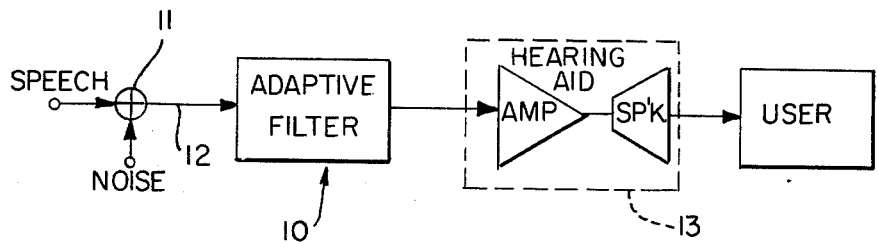
FIG. 1 is a block diagram showing an adaptive hearing aid according to the present invention being utilized with a voice communication system in the form of a conventional hearing aid.

Referring now to FIG. 1, reference numeral 10 designates an adaptive filter according to the present invention, such filter receiving an input signal comprising environmental noise, includng noise of the type described, and speech which are additively combined in transducer 11 which may be a microphone, for example. The input signal is applied to filter 10, which operates as described below, to filter noise of the type described from the input signal and apply a filtered signal to a communication system having an amplifier and a speaker, such system being shown as hearing aid 13. The hearing aid may be a conventional one well known in the art, or a hearing aid such as that disclosed in copending application Ser. No. 660,513 filed Feb. 23, 1976. The output of the hearing aid is applied to the ear of a user who is thus able to understand the intelligence in the speech portion of the input signal substantially unaffected by the presence therein of noise of the type described.

Filter 10 can be incorporated physically into hearing aid 13. Alternatively, filter 10 can be carried by the person wearing the hearing aid, and linked to the hearing aid via a wire or radio.

Figure 2:
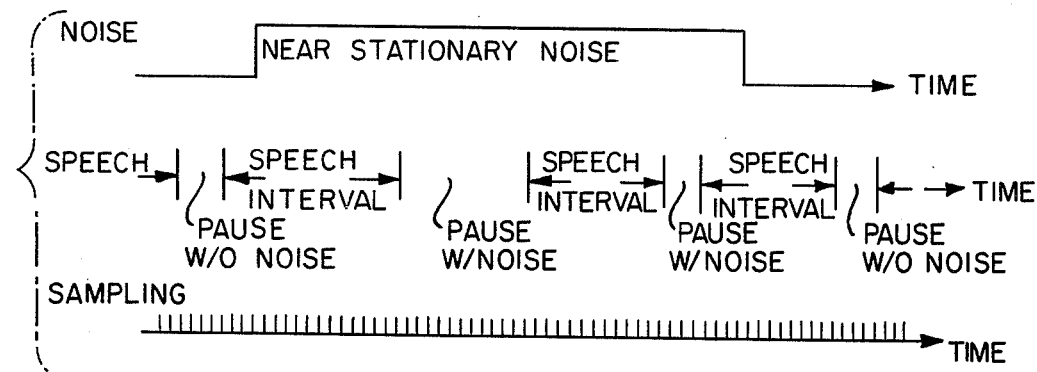
FIG. 2 is a time-sequence diagram showing a typical relationship between the occurrence of noise of the type described and a speech pattern.

The relationship between noise of the type described and speech is illustrated in FIG. 2. Speech is characterized by a series of separate speech intervals containing a single sound, word or group of sounds or words spoken by an individual. Between such intervals, there are pauses that do not contain intelligence and which may or may not contain noise of the type described depending on factors independent of the intelligence in speech intervals preceeding or succeeding a pause.

Figure 3:
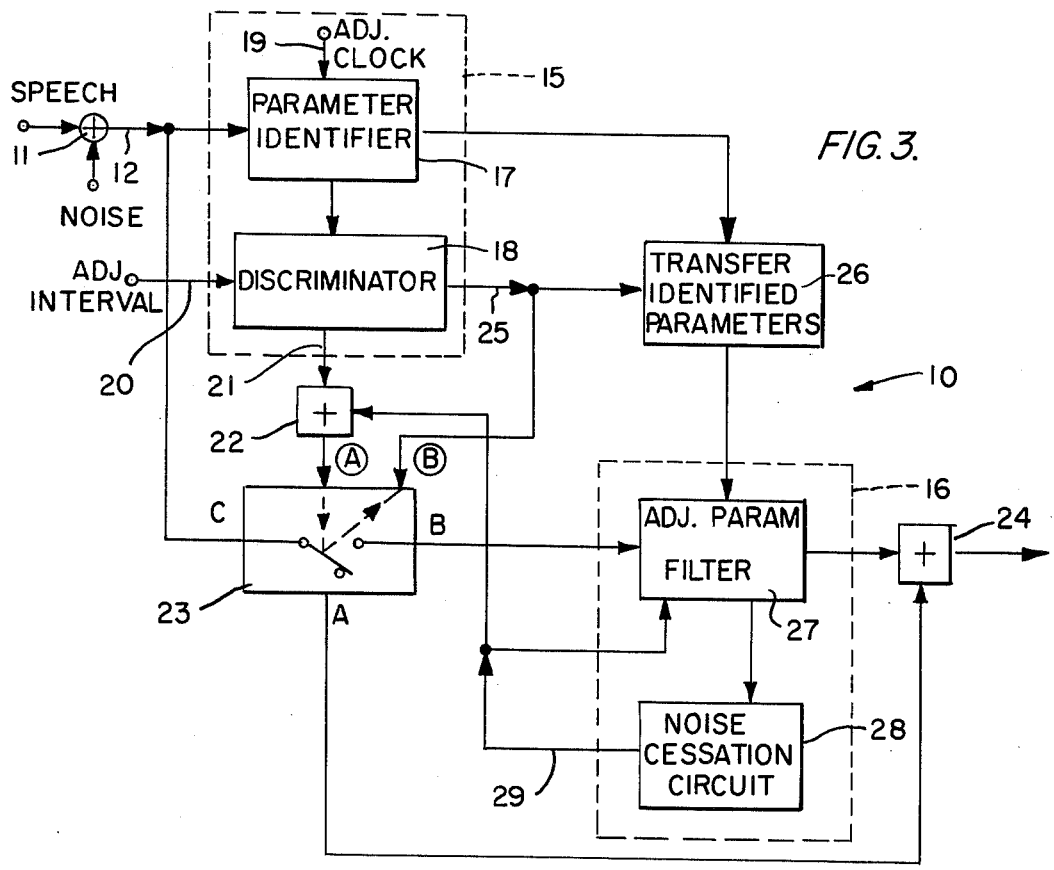
FIG. 3 is a block diagram showing the functional relationhip between the major components of an adaptive hearing aid according to the present invention.

Filter 10, as shown in FIG. 3, has two main components: recognition subsystem 15, and adaptive filter system 16. Subsystem 15 comprises parameter identifier 17 for identifying the parameters of the input signal, and discriminator 18 for examining the identified parameters to determine whether they meet predetermined criteria for being stationary. Parameter identification is preferably made using a time series identification such as an auto-regressive model identification, or an auto-regressive moving average model identification following the teachings in reference [1]. Alternatively, parameter identification can be by way of spectral identification based on transforming the times series identification model into the frequency domain using Fourier transformation processes. When the time series identification is an auto-regressive model identification, the transformation into the frequency domain can be carried out using Parzen's method as disclosed in reference [2].

Under the influence of clock input 19, parameter identification takes place periodically at successive identification intervals that are much shorter than the smallest interval of speech or pause between speech intervals likely to be encountered in normal speech patterns. Identification experiments show that the auto-regressive model parameters of speech usually vary at intervals of about 0.05 seconds. For this reason, the preferred sampling period is approximately 0.1 seconds, but other periods can be used. For this reason, the clock rate is indicated as being adjustable. The sampling intervals are subintervals of the speech and pause intervals as indicated in FIG. 2.

Discriminator 18 examines changes in the identified parameters over a number of identification intervals selected by input 20 to the discriminator in order to determine whether the identified parameters are stationary. During a speech interval, the identified parameters wll change significantly over a number of identification intervals independently of whether or not noise of any type including noise of the type described is present; and the identified parameters are not considered to be stationary. During a pause containing only noise of the type described, the parameters will not change at all over a number of identification intervals, or the change will be small. Changes within predetermined limits over a predetermined number of identification intervals establish the criteria that determines whether the parameters are stationary, and hence whether a pause contains noise of the type described.

During a pause without noise, the parameters will be zero and the output 21 of discriminator 18 passing through OR-gate 22 will operate on control means 23 connecting terminal C to terminal A and allowing the input signal to bypass subsystem 16 and appear at the output of gate 24. This connection is maintained until a pause containing noise of the type described is detected by discriminator 18. When this occurs the parameters identified by identifier 17 wll be characteristic of the noise and discriminator 18 will produce output 25 which, first of all, operates on control means 23 to connect terminal C to terminal B switching the input signal into subsystem 16. Output 25 also operates on transfer circuit 26 to effect the transfer of the identified parameters characteristic of the noise to the adjustable parameter section of filter means 27 of subsystem 16. Filter means 27 is thus adjusted so as to attenuate sharply those frequencies constituting the noise without substantially affecting other frequencies in the input signal.

Filter means 27 is preferably a minimum variance time domain filter of the type disclosed in reference [3]. For example, the filter can be an augmented Kalman filter of colored noise as described in reference [3], or it may be a realizable Wiener filter as described in references [4] and [5]. Alternatively the filter can be an adjustable notch filter such as described in references [6] and [7]. A realizable Wiener filter as discussed in Sec. 8.6 of reference [5], wherein the autocorrelation function of the noise can be computed from the autoregressive model parameters of the noise using the relationship between these terms as set forth in reference [1], may be used with a modification that the error cost is directly minimized to yield faster filtering than is achieved using the original learning algorithm of Sec. 8.6 of reference [5].

During the next speech interval following the detected noise-containing-pause, subsystem 16 is effective to substantially filter out the noise in the input signal while allowing the speech signal (less the noise frequencies) to pass substantially unaffected through gate 24. This situation remains in effect, with the noise parameters in the parameter section of the filter means being up-dated as each pause occurs, until the noise terminates. As described in detail below, subsystem 16 not only serves to filter noise in the input system during speeches following detection of a pause containing noise, but also serves to determine whether the noise has terminated during a speech interval.

When noise cessation circuit 28 recognizes the termination of noise during a speech interval, output 29 is effective to operate on control means 23, through OR-gate 22, disconnecting terminal C from terminal B and connecting it to terminal A which allows the input signal to pass directly to the output of gate 24. Thus, the noise free input signal bypasses filter means 27 during the balance of the speech interval within which the noise terminated. This arrangement eliminates distortion that the filter would have introduced after the noise terminates.

Output 29 is also effective to terminate the operation of filter means 27, and to clear its adjustable parameter section. The filter means is thus in condition for receiving a new set of parameters if the next pause contains noise of the type described.

Referring now to FIGS. 4A and 4B, where terminal a1 is connected to terminal a2, etc., a speech signal $s_k$ is additively combined with a noise signal of the type described designated $n_k$ to provide an input signal $y_k = n_k + s_k$. The input signal is applied to recognition subsystem 15A that includes a linear delay device 30 having a plurality of taps 31 at which the input signal $y_k$ appears delayed in time by the interval B. Considering the time delay B to be a delay operator, $$By_k \equiv y_{k-1},$$

$$B^2y_k \equiv By_{k-2}, \text{etc.}$$

The delayed input signals are applied to circuit 32 which computes the variance of the signal, and to circuit 33 which continuously identifies the parameters associated with characteristics of the input signal. Circuit 32 samples the analog inputs thereto, and computes the variance (i.e., the sum of the squares of the amplitude of the input signal at each instant of sampling, hereinafter referred to as the sampled variance), and applies it to threshold detector 34. If the variance does not exceed the limit of threshold detector 34 then the input signal at that instant must represent a pause without noise of the type described. An output from line 35 of detector 34 thus serves to open gate 36 which allows the input signal $y_k$ to pass into OR-gate 37 whose output is applied to a hearing aid, for example. In this case, the input signal is applied direcly to the hearing aid bypassing the other components of the adaptive filter.

An output on line 38 of detector 34, which occurs when the variance exceeds the threshold of detector 34, occurs when the input signal at that instant represents either a pause containing noise of the type described or speech (with or without noise). An output on line 38 is applied to gate 39 as well as to AND-gates 40, 41 of the adaptive filter subsystem 16A. Gate 39 directs the input signal $y_k$ into an augmented Kalman filter 42. Instead of this type of filter, block 42 may contain an adjustable notch filter, or a Wiener filter based on Sec. 8.6 of reference [5] described above. The latter two filters require only the noise parameters ($\alpha n$) for their setting. Hence, block 46 and gates 45 and 47 are not required in such cases.

The output of filter 42 is applied to OR-gate 37. The input to this filter is thus the input signal containing noise of the type described or speech which may or may not contain noise of the type described.

Parameter identifier 33 receives the tapped signals $y_k, y_{k-1}$, etc. and produces a plurality of outputs, one corresponding to each parameter $\alpha_y(B)$. Circuit 43 tests these parameters for being stationary. If the parameter-set is stationary (i.e., does not change over several indentification interludes), or if the parameter-set varies within predetermined limits over a fixed interval of time, the input signal $y_k$ cannot contain speech. The input signal must, therefore, be a pause containing noise of the type described if the variance exceeds the threshold of detector 34. Thus, if AND-gate 40 has an output, the input signal $y_k$ must be a pause containing noise of the type described. The output of gate 40 causes the noise parameters calculated by identifier 33 to be stored in buffer 43 in preparation for their use in the Kalman filter 42.

On the other hand, if AND-gate 41 has an output, that is, if $\alpha_y(B)$ parameters are nonstationary, and if at the same the sample variance of $y_k$ exceeds the threshold of the detector 34, then $y_k$ exceeds the threshold of the detector 34, then $y_k$ represents speech and gate 45 is opened to apply the noise parameters $\alpha_n$ characteristic of the noise of the type described occuring within the previous pause interval, to computer circuit 46 which computes the speech parameters $\alpha_s$ from the noise parameters $\alpha_n$ stored in buffer 44 and the input parameters $\alpha_y$ currently identified by identifier 33. The latter parameters are applied to a computer 46 through gate 47 by reason of the same output of circuit 43 which is applied to gate 41. It should be noted that the $\alpha_s$ parameters are not required as inputs to block 42 when the latter is a Wiener filter design following Sec. 8.6 of reference [5], or an adjustable notch filter.

Since the filter 42 is furnished with the noise parameters obtained during a pause containing noise of the type described, and since the rest of the parameters of this filter (if an augmented Kalman filter is used in block 42) are obtained from a speech interval following a noise containing pause and are continuously updated during the speech interval, the output of filter 42 will contain the estimate $\hat{s}_k$ of the speech signal $s_k$. Such an estimate of the speech signal will be available at the output of OR-gate 37. It should be noted that if block 42 contains an augmented Kalman filter, then both the noise parameters $\alpha_n$ obtained during the last pause containing noise, and the currently identified input parameters $\alpha_y$ are required to set the Kalman filter. The setting for this filter is in accordance with Section 12.8 of reference [1], taking note of the augmented form of such filter. Hence, the setting of the augmented Kalman filter requires the parameters $\alpha_s$ and the parameters $\alpha_n$ ($\alpha_5$ being computed from $\alpha_y$ and $\alpha_s$) for its setting. To set the Wiener filter based on Sec. 8.6 of reference [5], or to set a notch filter, only $\alpha_n$ is required.

If the noise of the type described lasts throughout the speech interval, the above-described state of affairs continues until a pause occurs containing noise of the type described.

If filter 42 is being supplid with the input signal by reason of the state of gate 39, and the noise terminates during a pause, gate 39 is closed because the output on line 48 disappears, and the input signal is applied to OR-gate 37 by way of gate 36 by reason of the initiation of an output on line 35. This state of affairs again continues until a pause occurs containing noise of the type described. Such noise may be characterized by similar or other parameters.

If the noise terminates during a speech interval, the operation of filter 42 is terminated in response to a change in the state error covariance P matrix of the Kalman filter (see section 8.1 of refrence [3]), and to a sudden drop in the sample covariance of the input signal. Circuit 50 (which is absent if block 42 is not based on an augmented Kalman filter) computes the P matrix, which is an estimate of the covariance of the difference between the speech signal $s_k$ and the best estimate of the speech signal $\hat{s}_k$ when the latter contains noise. Detector circuit 51 has an output when the threshold set in detector 41 is exceeded. Additionally, circuit 52 computes the change in the sample variance of the output of circuit 32, and threshold detector 53 determines when the change in variance drops suddenly. The coincidence of these events provides an output to gate 54 which serves to clear buffer 44 and to terminate the filtering action of filter 42. At the same time, gate 55 is opened to allow the input signal to pass to OR-gate 37 and bypass filter 42.

Alternatively, the termination of noise of the type described during a speech interval can be detected if the sample variance of the input $y_k$ suddenly drops when the filter output does not simultaneously drop.

The latter arrangement is alternative to that shown in FIGS. 4A and 4B, and is used with an augmented discrete Wiener filter or a notch filter is used at 42 in place of the augmented Kalman filter. If a notch filter is used, it will employ one or more notches or prespecified depth. In such case, the notch, or notches, would be adjusted so as to occur in the frequency range within which the noise of the type described has been identified as being mainly concentrated via either a time series identification model transformed to a frequency model, or via direct frequency spectrum analysis of the noise signal based on Fourier transforms thereof. The spectral estimate can be directly related to the auto-regressive model, if time-domain identification is employed by using spectral (minimum entropy) estimates as given in reference [2]. Regardless of which method is used, to obtain the model for the noise or the notch range for the notch filter, both the model and the notch range can be varied with time as long as the changes in the noise are gradual, or change moderately with time.

It is believed that the advantages and improved results furnished by the method and apparatus of the present invention are apparent from the foregoing description of the several embodiments of the invention. Various changes and modification may be made without departing from the spirit and scope of the invention as sought to be defined in the claims that follow.

What is claimed is:

1. A method for adaptively filtering noise of the type described from speech comprising the steps of:
   a. periodically identifying the parameters representing the characteristics of an input signal comprising said noise and speech;
   b. detecting the occurrence of pauses containing said noise between speech intervals;
   c. adjusting the parameters of a filter to those identified in response to detection of a pause containing said noise; and
   d. passing the input signal through the filter followng the detected noise containing pause only until cessation of said noise is detected.

2. A method according to claim 1 including the steps of:
   a. detecting the occurrence of pauses without said noise between speech intervals; and
   b. causing the input signal to bypass during this speech interval following the detected pause without noise.

3. A method according to claim 1 including the step of causing the input signal to bypass the filter in response to termination of said noise within a pause between speech intervals.

4. A method according to claim 3 including the step of causing the input signal to bypass the filter in response to termination of said noise during a speech interval.

5. A method according to claim 1 wherein the parameter identification is a time-series identification.

6. A method according to claim 5 wherein the parameter identification is an auto-regressive model identification.

7. A method according to claim 5 wherein the parameter identification is an auto-regressive moving average model identification.

8. A method according to claim 1 wherein the parameter identification is spectral identification and the frequency domain obtained by taking a transform of the input signal.

9. A method according to claim 1 wherein the parameter identification is obtained by spectral identification of a time-series model based on taking its Fourier transform.

10. A method according to claim 1 wherein the parameter identification is obtained by spectral identification of a time-series model based on transforming the model to a frequency domain model.

11. A method according to claim 1 wherein the parameter identification uses an auto-regressive model transformed into a frequency domain model.

12. An adaptive filter for filtering noise of the type described from speech comprising:
   a. discriminator means for periodically identifying the parameter representing the characteristics of an input signal comprising said noise and speech, and for detecting pauses containing said noise between speech intervals;
   b. filter means having adjustable parameters;
   c. control means responsive to detection of the pause containing noise for adjusting the parameters of the filter means to the identified parameters and for passing the input signal through the filter means following the detected noise-containing pause only until cessation of said noise.

13. An adaptive filter according to claim 12 wherein the discriminator means detects pauses without noise and said control means is responsive to detection of a pause without noise for causing the input signal to bypass the filter means.

14. An adaptive filter according to claim 12 including means responsive to termination of noise during a pause for causing the input signal to bypass the filter, and for preparing the filter means to accept a new set of parameters.

15. An adaptive filter according to claim 12 wherein the discriminator means includes means for computing the sampled variance of the input signal, and the adaptive filter includes means responsive to a sudden drop in the sampled variance for causing the input signal to by-pass the filter means.

16. An adaptive filter according to claim 12 wherein the filter means is in the form of an augmented Kalman filter, namely a colored measurement noise Kalman filter where certain noise vector elements augment the state vector.

17. An adaptive filter according to claim 12 wherein the filter means is in the form of an adjustable notch filter, namely a notch filter wherein the frequency location of the notch is adjustable.

18. An adaptive filter according to claim 12 wherein the filter means is in the form of a Wiener filter.

19. An adaptive filter according to claim 12 wherein the filter is a linear least square filter.

20. An adaptive filter according to claim 12 wherein the filter means is in the form of an augmented Kalman filter for colored measurement noise.

21. An adaptive filter according to claim 12 wherein the filter means is in the form of an augmented Kalman filter and the adaptive filter includes means for computing the state error covariance matrix P of the Kalman filter, and means responsive to a threshold increase in the value of the P matrix for causing the input signal to by-pass the filter means.

22. An adaptive filter according to claim 12 wherein the filter means is in the form of an augmented Kalman filter, and the adaptive filter includes means for computing the covariance matrix P of the Kalman filter, means for computing the sampled variance of the input signal, and means responsive to a sudden drop in the sampled variance simultaneously with a threshold increase in the value of the P matrix for causing the input signal to by-pass the filter means.

23. An adaptive filter according to claim 15 including means for monitoring the filter output and responsive to maintain one of the output when the sampled variance decreases suddenly for causing the input signal to by-pass the filter means.

24. A voice communication system including the adaptive filter of claim 12 in combination with an amplifier driven speaker whose input is derived from the output of the filter means during occurrence of noise of the type described.

25. A hearing aid system comprising an adaptive filter according to claim 12 in combination with a hearing aid whose input is the output of said filter means.

26. A hearing aid system according to claim 24 wherein the adaptive filter is physically incorporated into the hearing aid.

27. A hearing aid system according to claim 24 wherein the adaptive filter is physically separate from the hearing aid but is linked thereto by a wire.

28. A hearing aid system according to claim 24 wherein the adaptive filter is physically separate from the hearing aid but is linked thereto by a radio link.

* * * * *

UNITED STATES PATENT AND TRADEMARK OFFICE
CERTIFICATE OF CORRECTION

PATENT NO. : 4,025,721

DATED : May 24, 1977

INVENTOR(S) : Graupe et al

It is certified that error appears in the above-identified patent and that said Letters Patent are hereby corrected as shown below:

In the Abstract, line 3, after "occurring" insert --long-duration--; and line 4, after "noise" insert --(e.g., machinery noise)--.

Col. 2, line 43, change "filer" to --filter--.

Col. 2, line 55, after "pause" insert --interval. If the noise is occurring during a pause,--.

Col. 6, line 18, change "directy" to --directly--.

Col. 7, line 22, change "$\alpha_5$" to --$\alpha_s$--.

Col. 7, line 30, change "supplid" to --supplied--.

Col. 8, lines 23-24, cancel "noise of the type described" and substitute --near stationary, long-duration noise--.

Col. 9, lines 6-7, cancel "noise of the type described" and substitute -- near stationary, long-duration noise--.

Signed and Sealed this

Second Day of May 1978

[SEAL]

Attest:

RUTH C. MASON
Attesting Officer

LUTRELLE F. PARKER
Acting Commissioner of Patents and Trademarks